(12) United States Patent
Brunschwiler et al.

(10) Patent No.: US 8,586,411 B2
(45) Date of Patent: Nov. 19, 2013

(54) MANUFACTURING A FILLING OF A GAP IN SEMICONDUCTOR DEVICES

(75) Inventors: Thomas Brunschwiler, Rueschlikon (CH); Javier V. Goicochea, Rueschlikon (CH); Heiko Wolf, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 13/288,546

(22) Filed: Nov. 3, 2011

(65) Prior Publication Data

US 2012/0282739 A1    Nov. 8, 2012

(30) Foreign Application Priority Data

Nov. 16, 2010  (EP) ..................................... 10191294

(51) Int. Cl.
*H01L 21/00* (2006.01)
(52) U.S. Cl.
USPC ............................ 438/108; 438/118; 438/127
(58) Field of Classification Search
USPC ......................................... 438/108, 118, 127
See application file for complete search history.

(56) References Cited

U.S. PATENT DOCUMENTS

| | | | |
|---|---|---|---|
| 6,000,924 A * | 12/1999 | Wang et al. ................... | 425/125 |
| 7,641,811 B2 | 1/2010 | Kumar et al. | |
| 2004/0070881 A1 * | 4/2004 | Wu et al. ..................... | 360/234.6 |
| 2008/0220998 A1 | 9/2008 | Feger et al. | |
| 2009/0273073 A1 | 11/2009 | Tachibana et al. | |
| 2010/0038240 A1 | 2/2010 | Simons et al. | |
| 2010/0076120 A1 | 3/2010 | Emmerson et al. | |

OTHER PUBLICATIONS

Bruno Michel, "Thermal Crisis of Emerging Devices / Systems and Possible Solutions," 7th International Workshop on Future Information Processing Technologies, IBM: Zurich Research Lab, Advanced Thermal Packaging, Sep. 2007.
G.L. Lehmann et al., "Underflow Process for Direct-Chip-Attachment Packaging," IEEE Transactions on Components Packaging and Manufacturing Technology Part A (21), 1998.

* cited by examiner

*Primary Examiner* — Jarrett Stark
*Assistant Examiner* — John M Parker
(74) *Attorney, Agent, or Firm* — Cantor Colburn LLP

(57) ABSTRACT

A method for manufacturing a filling in a gap region between a first surface and a second surface includes applying a suspension comprising a carrier fluid and filler particles in the gap region between the first and the second surface; and withholding filler particles by a barrier element in the gap region to form a path of attached filler particles between the first surface and the second surface.

18 Claims, 12 Drawing Sheets

MANUFACTURING A FILLING OF A GAP IN SEMICONDUCTOR DEVICES

PRIORITY

This application claims priority to European Patent Application No. 10191294.7, filed 16 Nov. 2010, and all the benefits accruing therefrom under 35 U.S.C. §119, the contents of which in its entirety are herein incorporated by reference.

BACKGROUND

This disclosure relates to methods for manufacturing a filling in a gap region between two surfaces, for example, an underfill for flip-chip packages.

In modern electronic devices, substantial gains in performance are continuously achieved by means of circuit miniaturization and by the integration of single package, multi-functional chips. The scalability and performance of such electronic devices are related to their ability to dissipate heat. In typical flip chip arrangements, one integrated circuit (IC) surface is used for heat removal through a heat sink, while the other for power delivery and data communication. Power is delivered throughout solder balls attached to electrical pads on the IC chip that are flowed and coupled to the main circuit board.

To minimize mechanical stress in the solder balls and to protect them electrically, mechanically, and chemically, the gap region between the IC chip and board (created due to the presence of solder balls) is conventionally filled with electrically non-conductive materials, known as underfills. Current efforts towards 3D chip integration, with solder balls as electrical connection between silicon dies, demand high thermally conductive underfills to efficiently dissipate the heat of lower dies to the heat removal embodiment attached at the chip stack backside.

Conventional underfills consist of a curable matrix (e.g., epoxy resin) loaded with silica fillers, which have a similar thermal expansion coefficient (CTE) to that of the silicon. Currently, the requirement of matching CTE dictates the type, and volumetric fill of fillers to be employed in a given underfill. For thermal underfills the thermal conductivity of filler materials which are used to increase the thermal contact and enhance heat dissipation between connected surfaces should be high. Therefore, $Al_2O_3$, AlN, BN or other metal and non-metal materials, for example are used.

The application of underfills in gap regions is limited by the filler volume fraction, since the resulting viscosity depends on the filler content. According to some conventional methods the underfill material is applied to the chip periphery and capillary forces transport the viscous media into the gap, within a certain time period, prior to a temperature assisted curing. Generally, a high particle load, e.g., >30 vol % is needed to reach thermal conductivity values >0.5 W/m/K. Then, the viscosity of the applied medium may become too high to efficiently fill the gaps. Therefore, vacuum—or pressure-assisted filling processes, for example, as disclosed in U.S. Pat. No. 6,000,924 were proposed. However, the resulting thermal performance of the underfill may not be sufficient as it is required for 3D-integrated chips.

SUMMARY

According to an embodiment of a first aspect of the disclosure a method for manufacturing a filling in a gap region between a first surface and a second surface includes applying a suspension comprising a carrier fluid and filler particles in the gap region between the first and the second surface; and withholding filler particles by a barrier element in the gap region to form a path of attached filler particles between the first surface and the second surface.

DESCRIPTION OF THE SEVERAL VIEWS OF THE DRAWINGS

In the following, embodiments of methods and devices relating to the manufacture of thermally conducting fillings in a gap region are described with reference to the enclosed drawings.

Like or functionally like elements in the drawings have been allotted the same reference characters, if not otherwise indicated.

DETAILED DESCRIPTION

As used herein, the term "filler particles" refers to particles of essentially any shape than can be used for filling a void space. The filling particles can be small pieces or bits of a solid material. The filling particles can be embedded in a matrix.

"Withholding" essentially refers to keeping an item, as for example a filler particle, at least locally from moving freely. It is understood that withholding may also refer to restraining, arresting, blocking its way, stopping a particle, or obstructing a particle's trajectory. For example, a sieve withholds a particle from a suspension running through the sieve thereby preventing the particle from passing the sieve.

The term "attached", in particular with regard to attached filler particles, refers to particles that have a surface contact with each other. Attached particles, e.g., touch each other.

Figure 1:
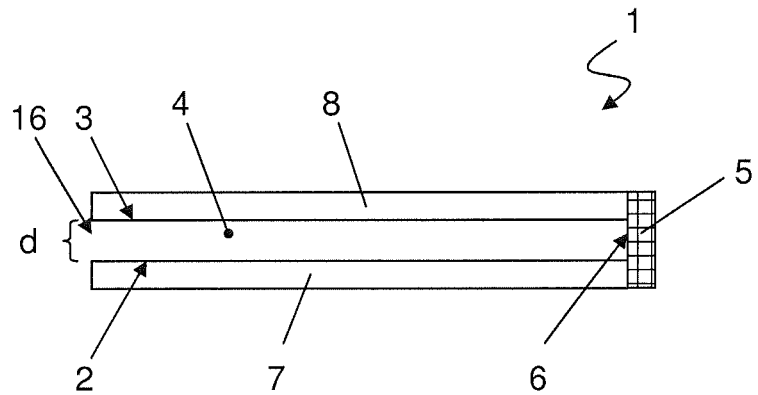
FIGS. 1-5 show schematic diagrams of an embodiment of a stacked-surface arrangement and illustrates method steps involved in the manufacturing of a thermally conducting filling in a gap region between two surfaces.

FIGS. 1-5 show schematic diagrams of a first embodiment of a stacked-surface arrangement and illustrates method steps involved in the manufacturing of a thermally conducting filling in a gap region between two surfaces. FIGS. 1-5 show cross-sectional views of a two-surface arrangement. In FIG. 1, a basic embodiment of a stacked surface arrangement 1 is illustrated. A gap region 4 is defined by two flat structural elements 7, 8 which are placed in parallel at a distance d. For example, the first structural element 7 can be a substrate or a circuit board, and the second structural element 8 can be an integrated circuit chip. However, FIG. 1 can also be seen as a detail of a multi-chip stack, wherein the lower and the upper structural element 7, 8 are integrated circuits.

FIG. 1 shows a first surface 2 and a second surface 3 of the substrate 7 and of the integrated circuit 8, respectively. In the orientation of FIG. 1 on the left-hand side, an inlet 16 for a fluid is shown, and on the right-hand side, an outlet 6 is shown. The outlet 6 is closed by a barrier element 5. The stacked-surface arrangement 1 as shown in FIG. 1 allows for an efficient method for filling the gap region 4 with a thermally conducting filling or underfill. The gap region 4 can be regarded as a cavity which is confined by the two surfaces 2, 3, the barrier element 5 at the outlet 6, the inlet 16 and two lateral barriers that are in-plane and therefore not shown in the figure.

For thermally connecting the two surfaces 2 and 3, a suspension is applied to the gap region 4. The suspension comprises a carrier fluid, which can be, for example, water or another liquid having sufficiently low viscosity for flowing in the gap 4. The carrier fluid is, hence, chosen as to allow for a flow or stream from the inlet 16 to the outlet 6. The suspension includes filler particles, of, for example, spherical shape. The filler particles have a relatively high thermal conductivity. The filler particles are preferably electrically isolating and have a thermal conductivity comparable to aluminum oxide. Feasible materials for the filler particles are $Al_2O_3$, SiC, AlN, or BN. Other materials can be contemplated.

Figure 2:
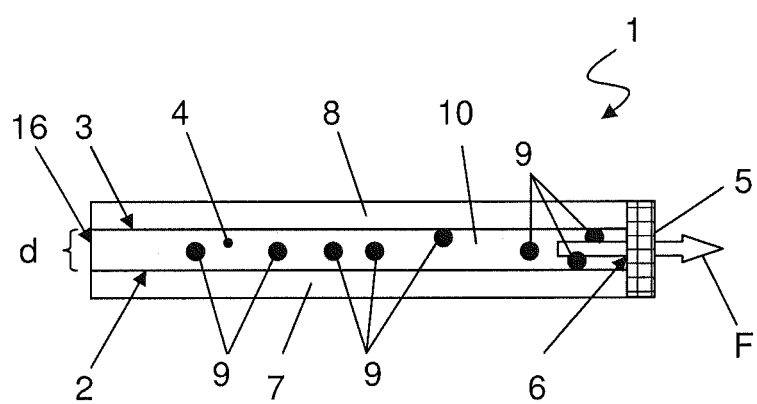

FIG. 2 shows the suspension being applied to the gap region 4. A flow F is generated from the inlet 16 to the outlet 6. The filler particles 9 are essentially dispersed in the carrier fluid 10. The barrier element 5 is implemented as to withhold the filler particles 9 at the outlet 6. For example, the barrier element 5 is implemented as a filter in terms of a porous medium, a micro strainer or sieve preventing the filler particles 9 from exiting through the outlet 6.

Figure 3:
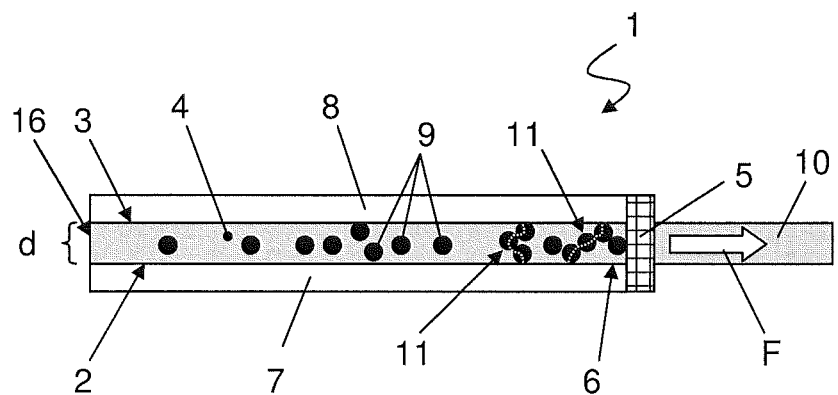

As a result, as shown in FIG. 3, filler particles 9 accumulate first in the outlet region 6 while the carrier fluid 10 essentially passes the barrier element 5 and exits the gap region 4. By withholding the filler particles 9 they accumulate downstream towards the outlet 6. There are chains or percolation paths of attached filler particles 9 formed between the first surface 2 and the second surface 3. In FIG. 3, as an example, two such percolation paths 11 are indicated by the white dotted lines between the surface 2 of the substrate 7 and the surface 3 of the integrated circuit chip 8.

Figure 4:
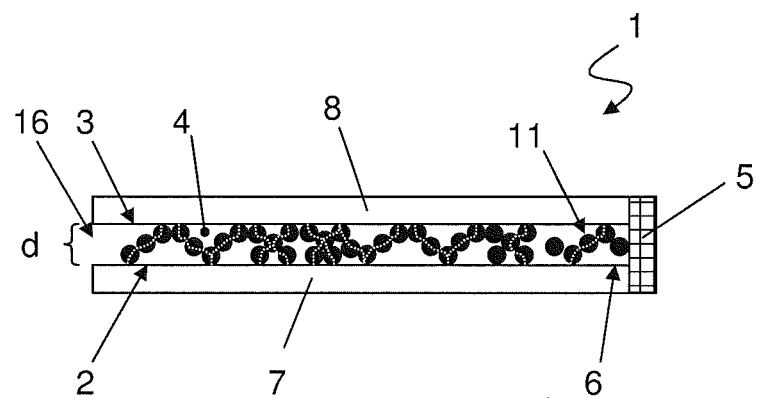

Further, generating a flow F of the suspension containing carrier fluid 10 or carrier liquid 10 with the filler particles 9 leads to the generation of a plurality of percolation paths 11 of attached filler particles 9. FIG. 4 shows accumulated filler particles 9 that have formed a plurality of percolation paths indicated by the white dotted lines connecting the first surface 2 with the second surface 3. The withheld filler particles 9 may form a network of particles attached to each other. The carrier fluid can be removed of the void spaces between the percolation paths 11. For example, the residual carrier fluid after the generation of percolation paths 11 is removed by evaporation. One may also apply a reduced surrounding pressure in order to facilitate the removal of any residual carrier fluid from the gap region 4. FIG. 4 shows the resulting network of percolated filler balls or particles 9. Percolation paths 11 stretching from one surface 2 to the other 3 are indicated by white dotted lines. Since the attached filler 9 particles connect thermally the first surface 2 with the second surface 3 without an interruption of the resulting path by voids it is sufficient to have a relatively low filling factor of the filler particles 9 in the gap region 4.

Figure 5:
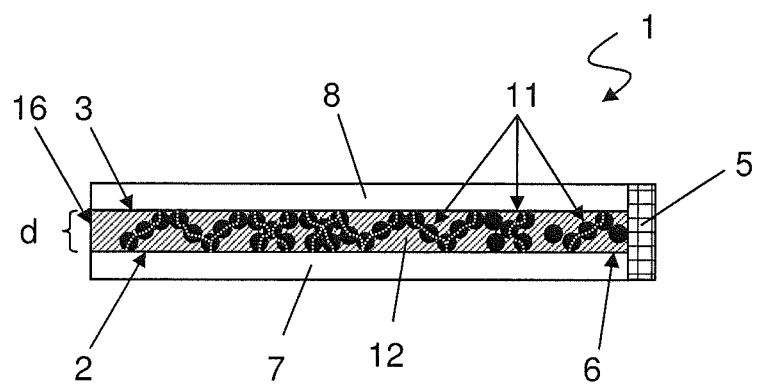

In an optional step, the void regions between the percolated filler particles 11 can be filled with a resin or an adhesive. For example, an epoxy resin can be filled into the gap region with the percolation paths 11 to stabilize the system mechanically. FIG. 5 shows the resulting stacked-surface arrangement 1 including the underfill. The first surface 2 of the substrate 7 is thermally coupled to the second surface 3 of the integrated circuit 8 by a plurality of attached filler particles 9 forming the percolation paths 11 between the two surfaces 2 and 3. The percolation paths 11 are further embedded in a resin for mechanically stabilizing the system. The inserted resin 12 can be cured and forms a stable underfill.

Figure 6A:
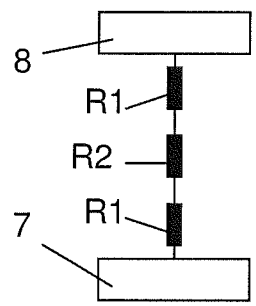
FIG. 6 shows schematic diagrams illustrating a heat transfer between surfaces.
Figure 19:
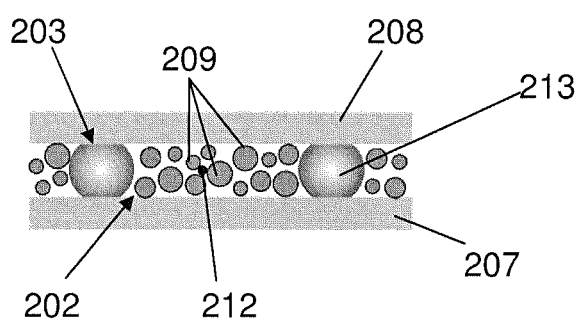
FIG. 19 shows a sectional view of a conventional underfill between two surfaces.

The percolation paths 11 facilitate the heat transfer considerably. FIG. 6 shows schematic diagrams illustrating a heat transfer between surfaces or elements. FIG. 6A shows a heat transfer between two surfaces or elements 7 and 8 through serially connected thermal conductors having a thermal resistance R1, R2, R1. For example, FIG. 6A corresponds to an underfill where filler particles are homogeneously distributed and each surrounded by an epoxy resin. FIG. 19 shows schematically a cross section through a system having two elements, e.g. a substrate 207 and an integrated circuit 208 each having a surface 202, 203 which are separated by solder balls 213. One can see from FIG. 19 that the filler particles 209 are separated by each other and surrounded by the resin 212. The serial resistance then reads R=R1+R2+R1, where R is the resulting total thermal resistance. Hence, there is a strong influence of the poorly conductive resin (R2).

Figure 6B:
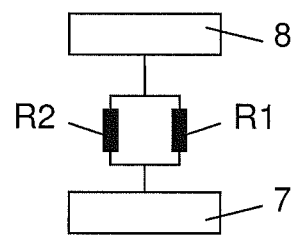

In contrast to the configuration shown in FIG. 6A, FIG. 6B shows two thermal resistances R1 and R2 arranged in parallel between the surfaces of a substrate 7 and an integrated circuit 8 corresponding to the configuration achieved by the method comprising a suspension (FIG. 5). R1 corresponds to the thermal resistance of the resin 12 as shown in FIG. 5 and R2 to the thermal resistance of the filler particles 9 or a percolation path 11. The heat transport through the parallel arrangement is much more efficient than the serial configuration of FIG. 6A. The resulting thermal resistance obeys the equation 1/R=1/R1+1/R2. It can be seen that the major part of the heat flow goes through the percolation paths corresponding to R2. Hence, arranging attached filler particles between the surfaces 2, 3 reduces the need of a high filling factor with respect to filler particles in a resin for an underfill. Conventional underfills, however, rely on a very large amount of filler particles or a high volume ratio of filler particles in the resin.

Investigations of the applicant show, that there is a strong dependence on the thickness of epoxy resin in a serial heat path as illustrated in FIG. 6A. As a consequence, the packing of filler balls or filler particles should be very high. In a parallel heat path arrangement, as shown in FIG. 6B, however, filling factors of less than 70%, and preferably less than 40%, for the filler particles lead to a good heat transfer between a substrate and an integrated circuit (i.e., an underfill as presented in FIG. 5 is more efficient than the arrangement of FIG. 19). For example, the thermal conductivity of an epoxy resin is approximately $k1=0.2$ W/(m*K), whereas a typical filler particle made of $Al_2O_3$ has $k2=46$ W/(m*K). For example, a total thermal conductivity of about $k=2-4$ W/(m*K) can efficiently be achieved using embodiments of the presented method.

Although the percolation paths improve a thermal conductivity the embodiments of the method for filling a gap region allows for densely packed or stacked filler particles in the gap region. One can achieve a relatively dense network of the filler particles because of the low viscosity of the suspension. Compared to conventional thermal pastes a high concentration or volume filling factor in the manufactured underfill is created in the gap after applying the suspension having a relatively low concentration of filler particles. In contrast to this, conventional pastes need to be applied already with the same filling factor as the resulting conventional underfill eventually has.

FIG. 7 shows schematic diagrams of an embodiment of a flip-chip device with a stacked surface arrangement and illustrates method steps involved in the manufacturing of a thermally conducting underfill. Flip-chips or controlled collapse chip connections (C4) avoid wire bonding techniques, and are widely employed in highly integrated electronics devices. Then, the active side of a silicon chip containing integrated circuits is faced downwards and mounted onto a substrate. The electronic connection is usually realized by solder balls coupled to a chip pad. Solder balls are deposited on such pads on the top side of the wafer during the chip manufacture. Then, the chip is flipped over onto a substrate, and the solder is flowed to realize the electric interconnect to the substrate.

Figure 7A:
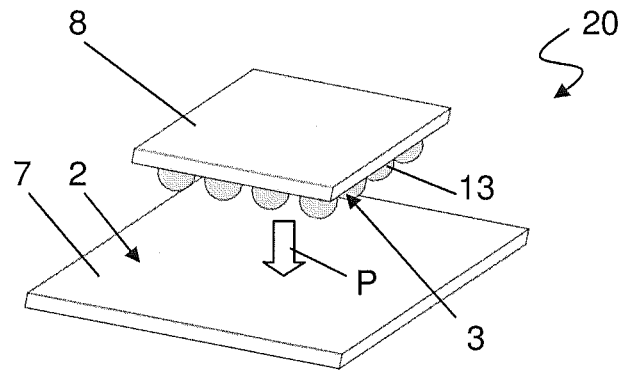
FIG. 7 shows schematic diagrams of an embodiment of a flip-chip device with a stacked-surface arrangement and illustrates method steps involved in the manufacturing of a thermally conducting underfill.

FIG. 7A shows a perspective view of a flip-chip which is placed onto a substrate. The flip-chip arrangement 20 schematically comprises the substrate 7 having a surface 2, the integrated circuit chip 8 having the solder balls 13 attached. The solder balls 13 are typically arranged in terms of an array. As illustrated in FIG. 7A, the chip 8 is placed onto the substrate 7 as indicated by the arrow P.

Figure 7B:
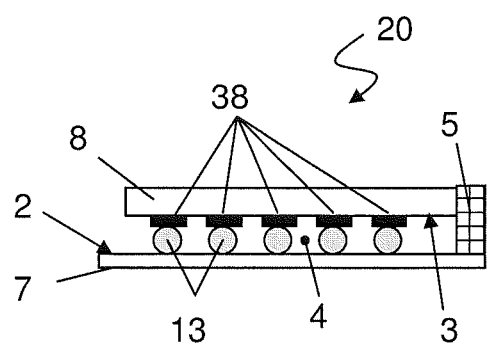

FIG. 7B shows the flip-chip arrangement 20 in a cross-sectional view. After soldering the solder balls 13, the bottom surface 3 of the integrated circuit 8 faces towards the upper surface 2 of the substrate 7. The solder balls 13 are attached to the integrated circuit 8 by pads 38. The arrangement is similar to what is shown in FIG. 1. There is provided a barrier element 5 for preventing filler particles in a suspension fed into the void or gap between the first and the second surface 2, 3 from exiting the gap.

Figure 7C:
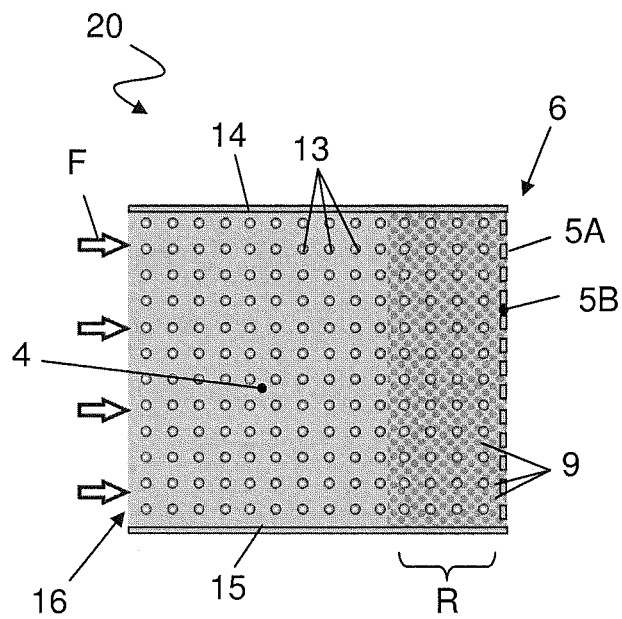

FIG. 7C shows a top view of the gap region 4 of the flip-chip arrangement 20. The gap region 4 is confined by the two surfaces 2 and 3 of the substrate 7 and the chip 8, respectively, which are essentially arranged in parallel to each other. Laterally, guide conducts 14 and 15 connect the two surfaces 2, 3 and form boundaries or edges of the gap region or cavity 4. The cavity or gap region 4 as shown in FIG. 7C is of rectangular shape. The guide conducts 14, 15 form opposite sides of the rectangular. In the orientation of FIG. 7C on the left, an inlet 16 for a suspension is provided. The inlet 16 stretches over the entire side of the rectangular area. In the orientation of FIG. 7C on the right-hand side, an outlet 6 can be seen.

A flow F of a suspension comprising a carrier liquid such as water or another liquid with low viscosity, and filler particles, as for example aluminum oxide particles, is generated from the inlet 16 to the outlet 6. The outlet 6 is implemented as a filter or sieve corresponding to one side of the rectangular area of the gap region 4. Hence, the outlet comprises barriers 5A which are separated by openings 5B. The openings 5B are arranged as to withhold filler particles within the gap region 4. Hence, the filter 5 corresponding to the outlet 6 is permeable for the suspension carrier fluid 10 but stops or withholds the filler particles 9. This results in an accumulation of filler particles 9 in the region R adjacent to the outlet 6. Consequently, a network of accumulated or stacked filler particles 9 develops and builds up until the entire gap region 4 is filled with filler particles 9.

Figure 7D:
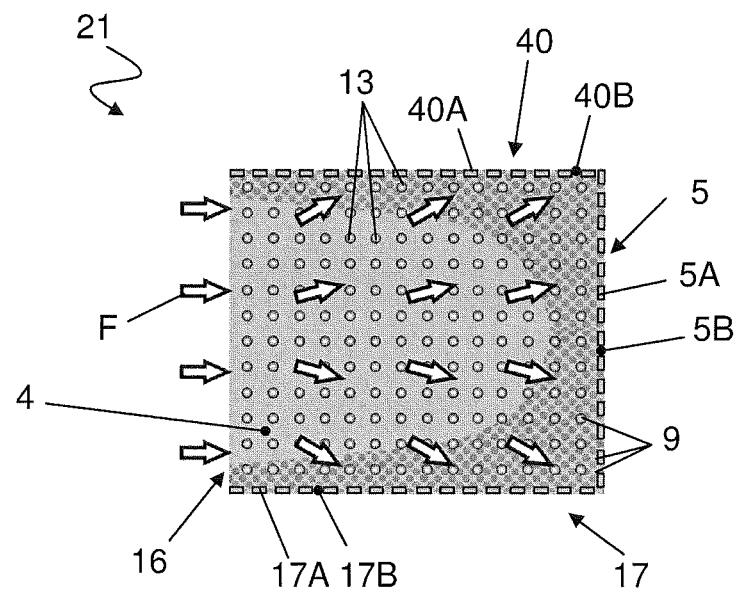
Figure 7E:
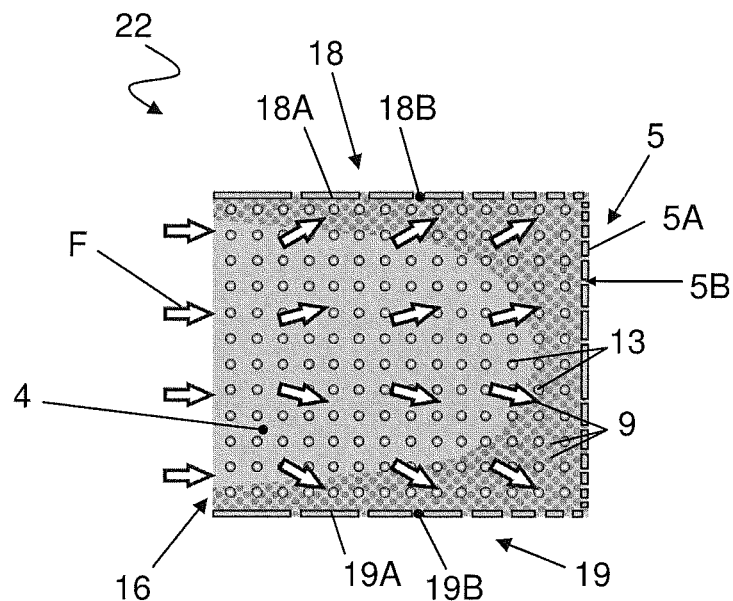
Figure 8:
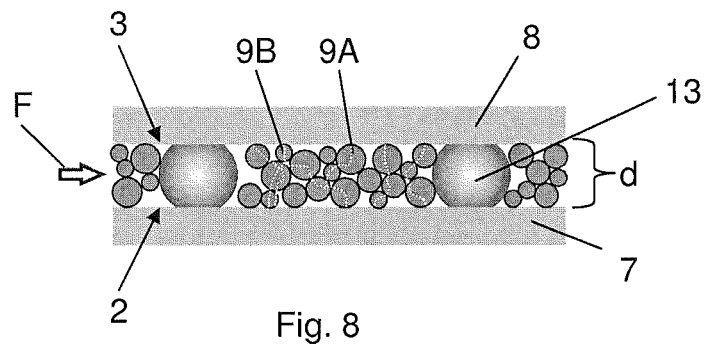
FIGS. 8-13 show sectional views of embodiments of stacked-surface arrangements for illustrating variations of methods for manufacturing thermally conducting underfills.

Referring to FIG. 8, a cross-sectional view of the flip-chip arrangement with the underfill comprising percolation paths from the substrate surface 2 to the chip surface 3 is shown. Turning back to FIG. 7, the suspension has for example a filling factor of less than 5 percent filler particles per volume. This allows for a relatively large and rapid flow from the inlet to the outlet and a quick accumulation of the filler particle network or stack. In one embodiment, the suspension includes only 0.1 volume percent filler particles. The suspension can be forced through the gap by an applied pressure. For example, a pressure difference between the inlet and the outlet of 1 bar is applied. The filter element 5 has a pore size that is less than the filler particle diameter.

FIG. 7D shows another embodiment of the flip-chip arrangement shown in a top view. The flip-chip arrangement 21 has a gap region 4 which is confined by one open inlet 16 forming one side of a rectangular area and three perforated boundaries 5, 17, 40. Hence, the flow of an injected suspension develops through the boundaries acting as filters. The boundaries 5, 17, 40 comprise barrier elements 5A, 17A, 40A that are separated by openings for 5B, 17B, 40B. The openings 5B, 17B, 40B have the same size or width and are permeable for the carrier liquid but stop filler particles and keep them within the boundaries 5, 17, 40. As a result of the permeable boundaries 5, 17, 40, filler particles 9 accumulate on three sides 5, 17, 40 of the gap region 4. Hence, the accumulation of the stacked filler particles grows from the boundaries towards the inner region of the gap area 4. By arranging the openings 5B, 40B, 17B appropriately the build-up of the filler particle network with the percolation paths perpendicular to the plane shown in FIGS. 7C-E can be accelerated.

FIG. 7E shows another embodiment of a stacked surface arrangement 22 with carrier-fluid permeable boundaries. In comparison to FIG. 7D, the boundaries 5, 18, 19 do not have regular openings 5B, 18B, 19B, but the length of the barrier elements 5A, 18A, 19A is modulated so as to optimize the build-up or accumulation of stacked filler particles along the fluid flow F. For example, there are more openings in the corners of the rectangular gap region 4 than in the middle of the sides of the boundaries 5, 18, 19.

Other modulations of openings and barrier elements along the boundaries of the gap regions can be contemplated. The boundaries of the gap regions as shown in FIGS. 7B-7E can be integrated or attached to the surfaces of the IC chip 8. Alternatively, the boundaries can be implemented as surface structures of the substrate. For example, the boundaries such as the guide conducts, inlet or outlet may be implemented by polyamide or plated metal structures.

FIGS. 8 to 13 show sectional views of embodiments of stacked surface arrangements for illustrating variations of methods for manufacturing thermally conducting underfills. The figures show, for example, a substrate 7 having a top surface 2 and a flip-chip 8 having a bottom surface 3. The gap between those two surfaces 2 and 3 is defined by solder balls 13. The spacing distance d essentially corresponds to the diameter of the solder balls. It is assumed that a suspension flow runs from left to right, and filler particles are withheld in the gap region as explained before.

FIG. 8 shows an isotropic stacking of filler particles that have different sizes. There is one type of filler particles 9A having a larger size and another type of filler particles 9B having a smaller size or diameter. Between the solder balls 13 many percolation paths thermally connecting the lower surface 2 with the upper surface 3 can be identified. The percolation paths are indicated by white dotted curves. Since eventually an adhesive or resin is inserted into the void regions between the filler particles it may be advantageous to have larger pore sizes or voids between the percolation paths of the filler particles 9A, 9B.

Figure 9:
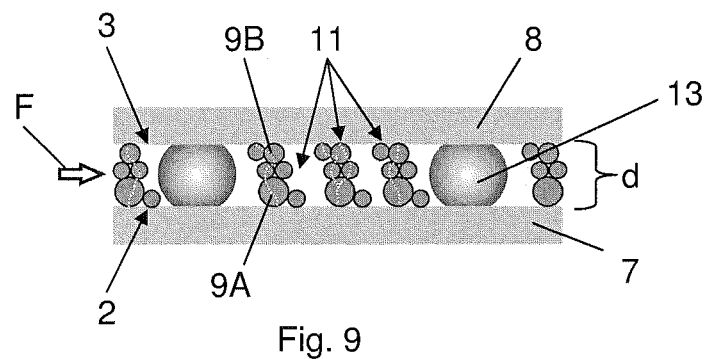

FIG. 9 shows an anisotropic distribution of stacked filler particles. The percolation paths are indicated by white dotted curves. Although, a plurality of percolation paths is present, the overall filling factor in the gap region is lower as compared to the configuration depicted in FIG. 8. By creating an anisotropic stacking having larger void regions between the percolation paths, an adhesive can be eventually injected more easily. By having the anisotropic configuration shown in FIG. 9, the injection of a resin or other adhesives is facilitated because the network of filler particles constitutes a lower hindrance for the resin or adhesive.

Figure 10A:
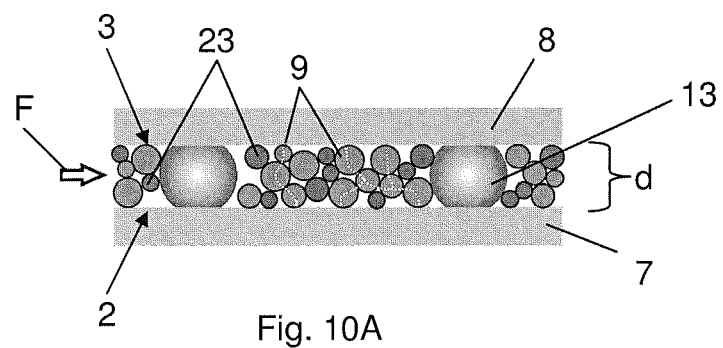
Figure 10B:
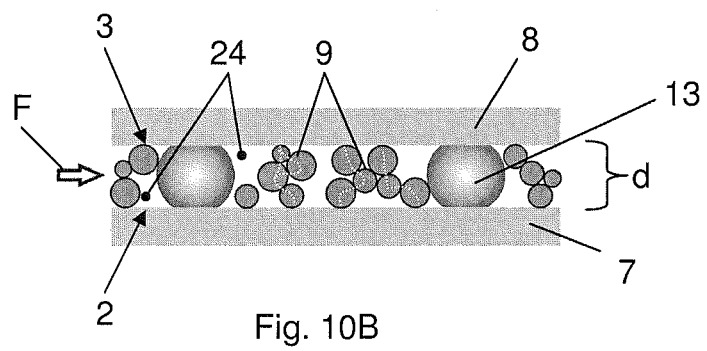

FIG. 10 illustrates another embodiment of the method for manufacturing a thermally conducting underfill. The suspension can be complemented with interstitial particles which are eventually removed from the stacked filler particles when the percolation paths are formed. Hence, in one embodiment, the suspension may contain filler particles 9 and interstitial particles 23 dispersed in a carrier fluid or liquid. The interstitial particles 23 can be dissolved eventually before an adhesive or resin is filled into the voids. FIG. 10A shows filler particles 9 and interstitial particles 23. All particles 9, 23 are first stacked in the gap region by the processes depicted before. Hence, the interstitial particles 23 and the filler particles 9 are withheld by appropriate barrier means. FIG. 10A shows a network of stacked particles 9, 23 in the gap region. Eventually, the interstitial particles 23 are dissolved, for example, by a washing agent in which the interstitial particles are soluble. As a result, void regions 24 between the percolation paths are enlarged. The percolation paths are indicated by white dotted curves. This is shown in FIG. 10B where at the positions of the interstitial particles 23 voids 24 occur. As a result, a higher anisotropic stacking is achieved.

Figure 11A:
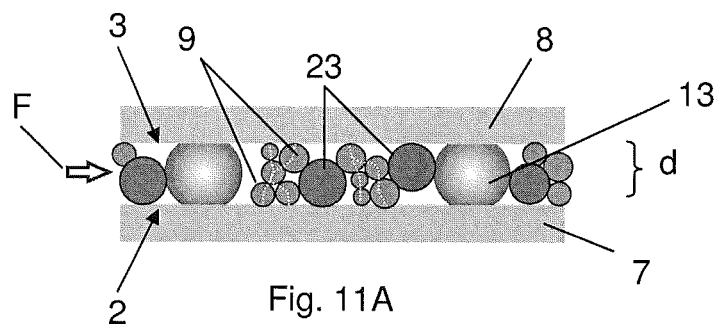
Figure 11B:
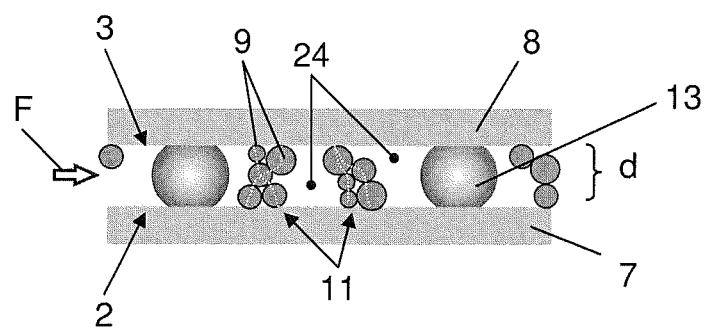

FIG. 11A shows stacking with interstitial particles 23 that have a larger diameter than the filler particles 9. For example, the interstitial particles 23 have a diameter that is larger than one half of the spacing distance, d. When the interstitial particles 23 are washed out or dissolved with a solvent eventually, higher anisotropic stacking is achieved as shown in FIG. 11B. By choosing the appropriate size and concentration of interstitial particles in the suspension one can engineer the distribution and isotropy or anisotropy of the stacked filler particles forming percolation paths between the surfaces. Preferably, the size and/or concentration of the filler particles 9 and/or the interstitial particles 23 is chosen as a function of the spacing distance d of the gap region.

FIG. 12 shows another embodiment of method steps involved in manufacturing a thermally conducting underfill. The used suspension comprises interstitial particles 26 that are at least partially permeable for the carrier liquid. For example, interstitial particles 26 can be implemented as spheres with boreholes 25 allowing the carrier liquid of the suspension to flow through the respective hole 25.

Figure 12A:
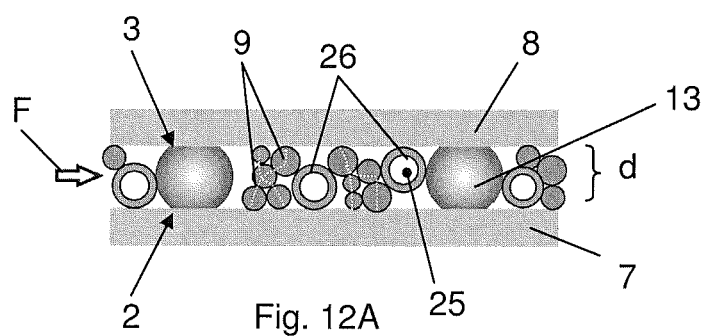
Figure 12B:
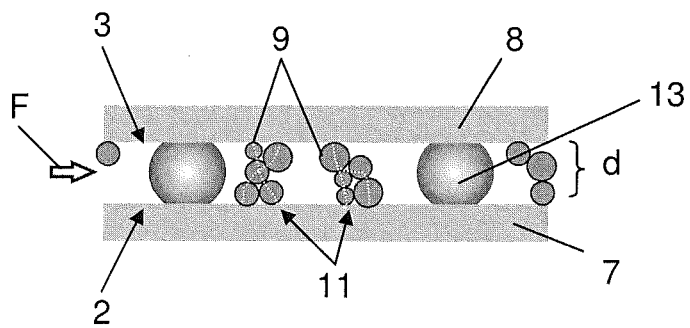

This is depicted in FIG. 12A. The porous interstitial particles 26 may allow a better flow of eventually injected adhesive when the stacks as shown in FIG. 12A of filler particles are built up. Alternatively, the porous interstitial particles 26 can be washed out by a washing agent as mentioned before. As a result, anisotropic filler particle stacks forming percolation paths are formed as shown in FIG. 12B. The percolation paths are indicated by white dotted curves.

Figure 13:
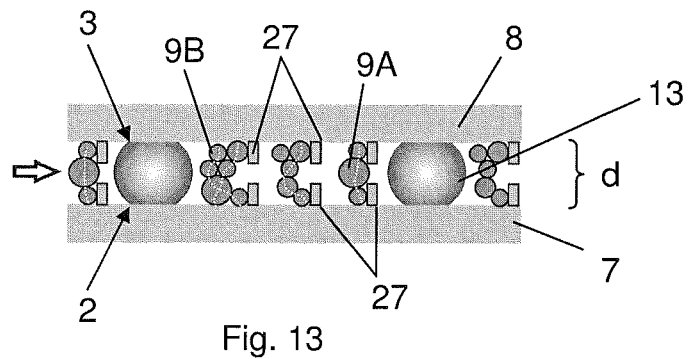

FIG. 13 shows an additional variety for obtaining an anisotropic stacking of filler particles in the gap region. In the illustration of FIG. 13 barrier elements 27 are arranged on the bottom surface 2 and top surface 3. The barrier elements 27 reach from the surface towards the center of the gap. The barrier elements 27 provide for a hindrance of the filler particles when moving with the flowing suspension to the respective outlet. Hence, the barrier elements 27, which can be distributed along the entire gap region, withhold at least partially the filler particles 9A, 9B. In the picture of FIG. 13 barrier elements protrude from the surfaces 2, 3. The barrier elements 27, for example, can be implemented as a surface structure of the substrate and/or the IC surface. By use of additional barrier elements 27 for withholding filler particles 9A, 9B in the suspension flow, the stacking of the filler particles 9A, 9B can be geometrically determined.

Figure 14:
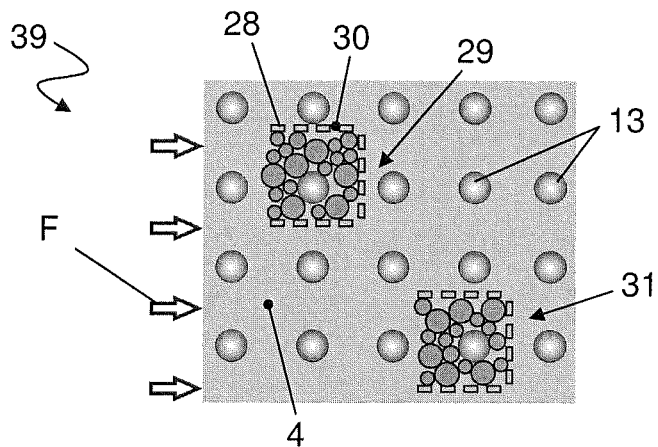
FIG. 14 shows a top view of an embodiment of a stacked-surface arrangement having additional barrier elements.

FIG. 14 shows a top view of a section of the gap region 39. The suspension flow F runs from left to right in the orientation of FIG. 14. Barrier elements are arranged as local filters in the gap region 4. For example, in FIG. 14, two local filter arrangements 29, 31 are arranged around solder balls 13. The filter arrangements 29, 31 comprise barrier elements 28 and openings 30 and may act as gates that surround solder balls 13 downstream. By placing barrier elements 29 at various positions in the gap region 4, the formation of percolation paths connecting the two surfaces with a thermal bridge is easily achieved.

FIG. 15 shows illustrations of additional barrier elements protruding from one of the two surfaces for obtaining desired filler particle stacks or filler particle percolation arrangements. FIG. 15A shows a top view with a barrier element 32 having an angular shape. The barrier element has two legs 32A, 32B which are arranged in an angle. A suspension flow F is assumed to run into the paper plane of FIG. 15A. The size of the barrier element 32 is adapted to the size of the filler particles which may have spherical shape. For example, four filler particles 33, 34, 35, 36 are trapped by the barrier element 32. The barrier element 32 can also be called a trapping site.

Figure 15A:
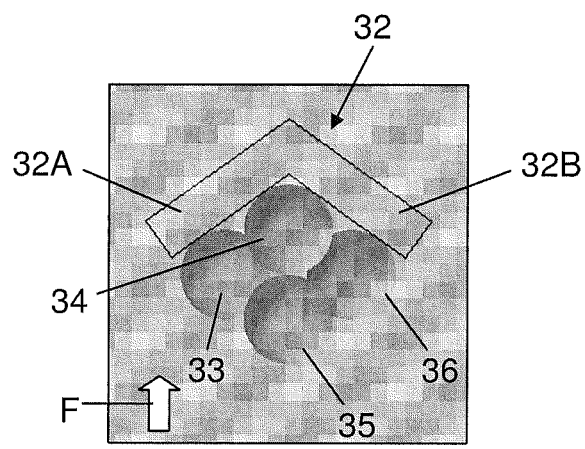
FIG. 15 shows views of an embodiment of a trapping site for withholding filler particles.
Figure 15B:
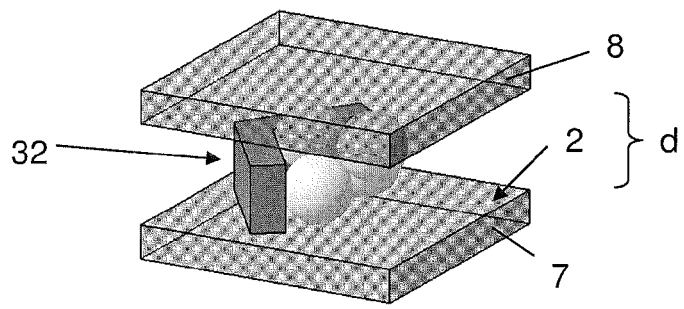

FIG. 15B shows a perspective view from one side of the trapping site 32. The barrier element or trapping site 32 protrudes from the bottom surface 2, for example of the substrate 7 into the gap region between the first surface 2 and the second surface 3 of the flip-chip 8.

Figure 15C:
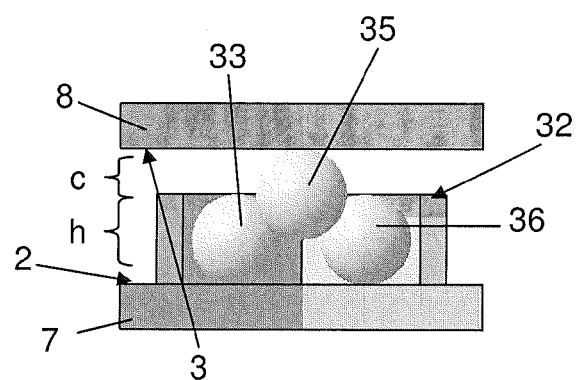
Figure 15D:
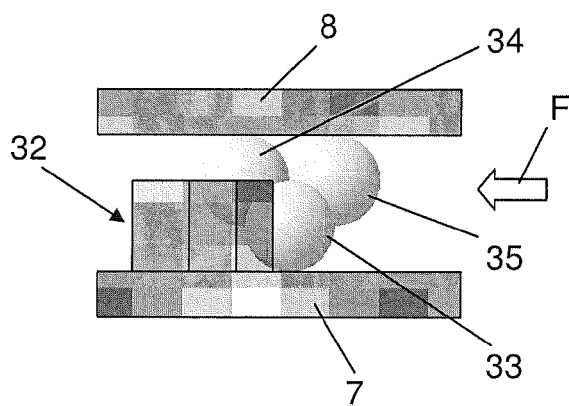

FIG. 15C shows a cross-sectional view perpendicular to the flow direction. FIG. 15D shows a side sectional view parallel to the flow direction F. The height h of the trapping site 32 is less than the spacing distance d between the two surfaces 2, 3 thereby creating a clearance or head room c for the carrier fluid to flow. The trapping 32 site is arranged as to withhold upper filler particles 34, 35 that are pressed against the top surface 3 and lower filler particles 33, 36 that are pressed against the lower surface 2 by the carrier fluid flow F. The arrangement of trapped filler balls or filler particles 33, 34, 35, 36 realizes several percolation paths between the surfaces 2 and 3. By adjusting the geometry of the trapping site 32 one can instigate preferred arrangements of percolation paths by attached filler particles.

Figure 16:
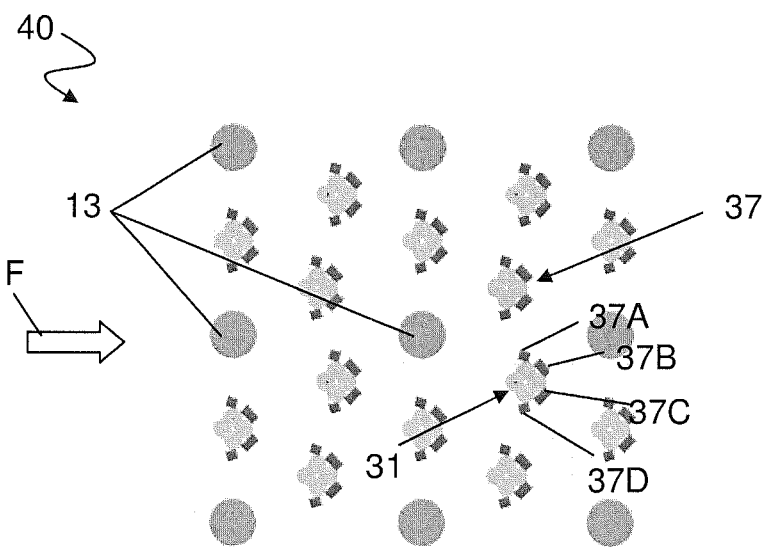
FIG. 16 shows a top view of another embodiment of a stacked-surface arrangement having additional barrier elements.

FIG. 16 shows another detailed top view of a section of a gap region with modified trapping sites. FIG. 16 illustrates a plurality of solder balls 13 from top and trapping sites 37 in between. The section 40 shows trapping sites 37 comprising four barrier elements 37A, 37B, 37C, 37D that are arranged in a semi-circle or arc with its opening facing against the flow direction F of the suspension. The size and arrangement of the trapping sites 37 leads to four accumulated filler particles 31 per tracking site. Hence, by arranging trapping sites in a structured manner between the solder balls 13, one can predetermine the positions of thermally conducting percolation paths formed by filler particles 31.

Figure 17:
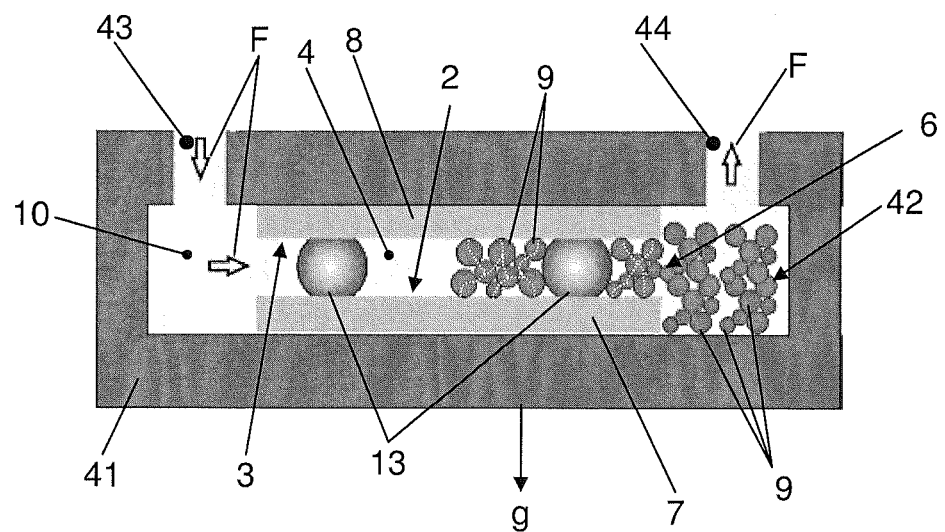
FIG. 17 shows a sectional view of an embodiment of an stacked-surface arrangement for illustrating an embodiment of the method for manufacturing thermally conducting underfill.

FIG. 17 shows a sectional view of an embodiment of stacked-surface arrangements for illustrating another embodiment of the method for manufacturing thermally conducting underfill. For applying the suspension of carrier fluid 10 and dispersed filler particles 9 the stacked-surface structure is placed in an enclosure 41 or the stacked-surface is encapsulated. The enclosure 41 has an inlet 43 for the suspension and an outlet 44 of the suspension. The enclosure 41 is adapted to guide the flow F of the suspension 10 through the gap region 4 between the first and the second surface 2, 3, and inlet 43 and outlet 44 of the enclosure 42 are arranged at the top side.

FIG. 17 shows gravity g pointing downwards. Hence, when the flow F of the suspension is sufficiently slow filler particles 9 may sediment onto the bottom surface 2. FIG. 17 shows an enhanced sedimentation of filler particles 42 in the vicinity of the outlet 6 of the gap region 4. The sedimented particles 42 form a barrier for the remaining filler particles 9 in the gap region 4 flowing from the inlet 43, through the elongated gap region 4, the outlet 6 of the gap to the outlet 44 of the enclosure 41. Then, the filler particles 9 are kept in the gap region as the sediment 42 acts as a filter or barrier at the outlet 6. Consequently, percolation paths indicated by white dotted lines are generated in the gap 4.

As depicted in FIG. 17, the filler particles 9 may act as barrier elements themselves. By arranging the stacked-surface arrangement in an enclosure and taking advantage of gravitational forces a percolation network can be stimulated in terms of sedimentation of particles.

FIG. 18 shows schematic diagrams of a multi stack of flip-chip integrated circuits with a thermal underfill and illustrates method steps involved in the manufacturing of a thermal underfill in the gap regions between the ICs. In packages with controlled collapse chip connections (C4) the underfill of gaps between adjacent chips is considered the main thermal bottle neck in a chip stack. While most of the thermal power is transversely distributed by the solder balls connecting the various chips, it is desirable to have a relatively uniform coefficient of thermal extension along the entire package. Hence, a thermal conductive underfill or filler is preferably highly thermally conducting.

Figure 18A:
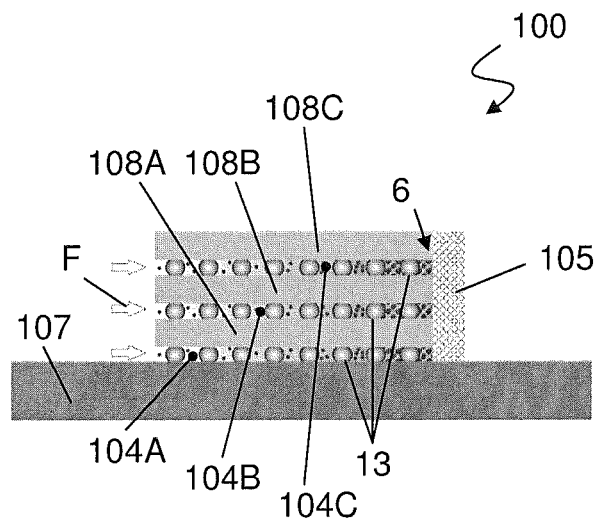
FIG. 18 shows schematic diagrams of an embodiment of chip stack arrangement and illustrates steps involved in the manufacturing of a thermally conducting filling in a gap region between surfaces.

FIG. 18A shows a chip stack comprising three chips 108A, 108B, 108C placed on top of each other on a substrate 107. The electrical connection to the substrate 107 and the electrical interconnect between the chips are realized by solder balls 13. Optionally, on the top chip 108C a cooler device can be attached by use of a thermal paste.

In the illustration of FIG. 18A, three gap regions 104A, 104B, 104C can be seen between the chips 108a, 108b, 108c and the substrate 107. There is provided a filter element 105 that encloses the gap regions 104A, 104B and 104C. The filter element 105 can comprise, for instance, a fibrous web or fleece appropriate for withholding filler particles that are dispersed in a suspension. The arrows F in FIG. 18A indicate a flow of the suspension including filler particles and a carrier fluid. The carrier fluid passes the filter element 105 while in the gap region the filler particles accumulate and form percolation paths connecting the various surfaces of the chip stack that are opposite to each other. The process is performed along the lines as explained with respect to FIGS. 1 to 5.

Figure 18B:
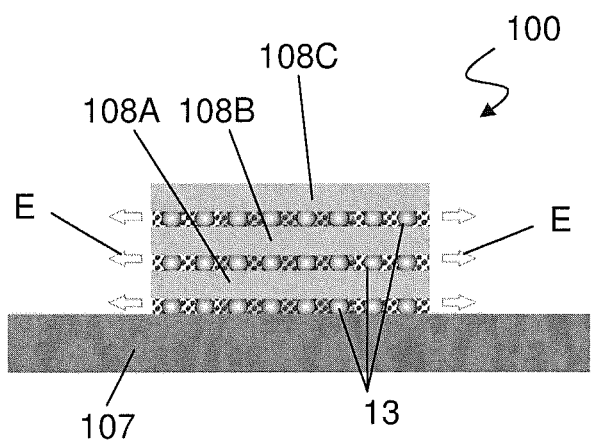

Next, the filter element 105 can optional be removed as it is shown in FIG. 18B. Then, for example, by increasing the temperature, residual carrier fluid is evaporated which is illustrated by the arrows E in FIG. 17B. Hence, void regions between the percolation paths of the filler particles are created.

Figure 18C:
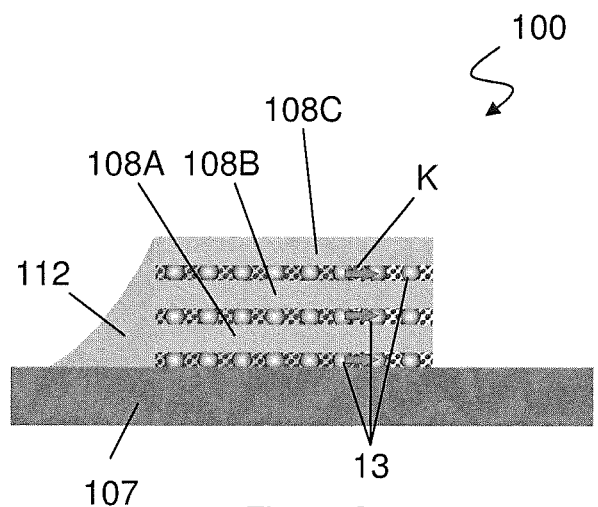

Next, an adhesive or resin is injected into the void regions between the percolation paths of the filler particles. FIG. 18C shows the filling of the void spaces by a resin 112 by use of capillary forces K.

Figure 18D:
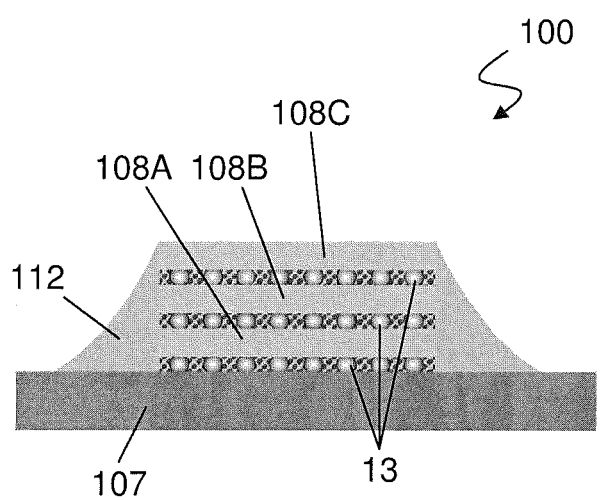

Finally, FIG. 18D shows the chip stack 100 with an underfill having a high thermal coefficient because of the percolating paths of attached filler particles connecting the surfaces of the substrate and the integrated circuit chips 108A, 108B, 108C.

Embodiments of the present disclosure provide for an efficient method for manufacturing a highly thermally conductive underfill between stacked surfaces. By using a suspension with a carrier liquid and filler particles, the build-up of a percolation network of filler particles can be achieved. In contrast conventional methods, where a resin with filler particles is applied, for example, by use of a vacuum or under high pressure, usually a thermally isolating area of resin around the filler particles is present.

The presented embodiments of the method and the stacked surface arrangement can readily be modified. For example, the method can be applied to a gap region of an irregular geometry where convective forces may deliver particles within the gap. Hence, the surfaces defining the gap region are not constrained to parallel surfaces.

Hence according to some aspects of the presented embodiments of methods for filling a gap region with convective forces, highly-packed thermal percolating networks between involved particles and substrates are created, and/or structures that promote particle stacking at selected sites or locations are employed.

The particles may accumulate in the gap region due to filters, trapping sites or sedimentation allowing the built-up of thermally percolating networks that connect all substrates. Once the gap region is completely filled, the carrier fluid can be removed, e.g. by mechanical, thermal or chemical means and can be replaced by a final matrix, e.g. epoxy resin, which can be cured eventually to define the mechanical property of the generated composite material in the gap. In this way, the filling process with the filler particles may be decoupled from the insertion of a matrix material. Optionally, subsequent surface treatments, particle removal and epoxy filling can be performed.

LIST OF REFERENCE CHARACTERS 1 stacked-surface arrangement
2 first surface
3 second surface
4 gap region
5 filter element
5A filler particle barrier
5B opening
6 outlet
7 substrate
8 integrated circuit chip
9 filler particle
9A large filler particle
9B small filler particle
10 carrier fluid
11 percolation path
12 resin
13 solder ball
14, 15 guide conduct
16 inlet
17 filter outlet
17A filler particle barrier
17B opening 18 outlet
18A filler particle barrier
18B opening
19 filter outlet
19A filler particle barrier
20 flip chip package
21 flip chip package
22 flip chip package
23 interstitial particles
24 voids
25 borehole
26 porous interstitial particle
27 barrier element
28 barrier element
29 local filter
30 opening
31 local filter
32 trapping site
33-36 filler particle
37 trapping site
37A-37D trapping element
38 pad
39, 40 gap section
41 encapsulation
42 sedimented filler particles
43 suspension inlet
44 suspension outlet
100 multi-chip stack
104A gap region
104B gap region
104C gap region
105 filter element
107 substrate
108A chip
108B chip
108C chip
112 resin
200 underfill apparatus
201 flip-chip underfill
202 feeder
203 cap
204 gap
206 outlet
207 substrate
208 chip
209 base plate
c clearance
d spacing distance
g gravity
h barrier height
E evaporation
F flow direction
K capillary force
P chip placement
R1, R2 thermal resistance
R outlet region

What is claimed is:

1. A method for manufacturing a filling in a gap region between a first surface and a second surface, the method comprising:
  applying a suspension comprising a carrier fluid and filler particles in the gap region between the first and the second surface;
  withholding filler particles by a barrier element in the gap region to form a path of attached filler particles between the first surface and the second surface;
  laterally confining the gap region by at least one guide conduct, an inlet and an outlet for the suspension; and
  providing additional barrier elements in the gap region between the inlet and the outlet for withholding filler particles.

2. The method of claim 1, wherein at least one percolation path is formed by the withheld filler particles between the first surface and the second surface.

3. The method of claim 1, wherein the suspension is applied to the gap region by convection.

4. The method of claim 1, wherein applying the suspension comprises generating a flow of the suspension along the gap region from an inlet to an outlet.

5. The method of claim 1, further comprising removing residual carrier fluid from the gap region after withholding filler particles.

6. The method of claim 1, wherein the filler particles comprise a thermally conducting and electrically insulating material.

7. The method of claim 1, wherein first surface and the second surface are spaced by a plurality of solder balls having a predetermined diameter.

8. A method for manufacturing a filling in a gap region between a first surface and a second surface, the method comprising:
  applying a suspension comprising a carrier fluid and filler particles in the gap region between the first and the second surface; and
  withholding filler particles by a barrier element in the gap region to form a path of attached filler particles between the first surface and the second surface;
  wherein the barrier element is permeable for the carrier fluid.

9. A method for manufacturing a filling in a gap region between a first surface and a second surface, the method comprising:
  applying a suspension comprising a carrier fluid and filler particles in the gap region between the first and the second surface; and
  withholding filler particles by a barrier element in the gap region to form a path of attached filler particles between the first surface and the second surface, wherein the withholding comprises filtering the suspension in the gap region.

10. A method for manufacturing a filling in a gap region between a first surface and a second surface, the method comprising:
  applying a suspension comprising a carrier fluid and filler particles in the gap region between the first and the second surface;
  withholding filler particles by a barrier element in the gap region to form a path of attached filler particles between the first surface and the second surface; and
  providing a filtering element as barrier element in the gap region.

11. The method of claim 10, wherein the filtering element is placed at the outlet.

12. The method of claim 11, wherein the withholding comprises accumulating filler particles in a region of the gap region which is adjacent to the outlet.

13. A method for manufacturing a filling in a gap region between a first surface and a second surface, the method comprising:
  applying a suspension comprising a carrier fluid and filler particles in the gap region between the first and the second surface;

withholding filler particles by a barrier element in the gap region to form a path of attached filler particles between the first surface and the second surface; and filling void space between the withheld filler particles in the gap region with a resin.

14. A method for manufacturing a filling in a gap region between a first surface and a second surface, the method comprising:

applying a suspension comprising a carrier fluid and filler particles in the gap region between the first and the second surface; and withholding filler particles by a barrier element in the gap region to form a path of attached filler particles between the first surface and the second surface;

wherein the first surface and the second surface are essentially arranged in parallel at a spacing distance, and wherein a diameter of the filling particles is at least half the spacing diameter.

15. A method for manufacturing a filling in a gap region between a first surface and a second surface, the method comprising:

applying a suspension comprising a carrier fluid and filler particles in the gap region between the first and the second surface; and withholding filler particles by a barrier element in the gap region to form a path of attached filler particles between the first surface and the second surface' wherein the suspension comprises at least a first type of filler particles and a second type of filler particles, wherein the first type and the second type of filler particles have different diameters.

16. A method for manufacturing a filling in a gap region between a first surface and a second surface, the method comprising:

applying a suspension comprising a carrier fluid and filler particles in the gap region between the first and the second surface; and withholding filler particles by a barrier element in the gap region to form a path of attached filler particles between the first surface and the second surface;

wherein the suspension further comprises interstitial particles for separating withheld filler particles in the gap region.

17. The method of claim 16, wherein the interstitial particles are at least partially permeable for the carrier fluid.

18. The method of claim 17, further comprising:

after withholding carrier particles and interstitial particles, removing the interstitial particles by means of a washing agent.

* * * * *